(12) United States Patent
Ahsan et al.

(10) Patent No.: US 7,733,109 B2
(45) Date of Patent: Jun. 8, 2010

(54) TEST STRUCTURE FOR RESISTIVE OPEN DETECTION USING VOLTAGE CONTRAST INSPECTION AND RELATED METHODS

(75) Inventors: Ishtiaq Ahsan, Wappingers Falls, NY (US); Mark B. Ketchen, Hadley, MA (US); Kevin McStay, Hopewell Junction, NY (US); Oliver D. Patterson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/872,213

(22) Filed: Oct. 15, 2007

(65) Prior Publication Data

US 2009/0096461 A1 Apr. 16, 2009

(51) Int. Cl.
*G01R 31/302* (2006.01)
(52) U.S. Cl. .................. 324/763; 324/501; 324/751
(58) Field of Classification Search ................ None
See application file for complete search history.

(56) References Cited

U.S. PATENT DOCUMENTS

| | | | | |
|---|---|---|---|---|
| 4,912,052 A | * | 3/1990 | Miyoshi et al. | 324/751 |
| 5,929,650 A | * | 7/1999 | Pappert et al. | 324/763 |
| 5,959,459 A | | 9/1999 | Satya et al. | |
| 6,239,603 B1 | * | 5/2001 | Ukei et al. | 324/763 |
| 6,351,134 B2 | * | 2/2002 | Leas et al. | 324/765 |
| 6,861,666 B1 | | 3/2005 | Weiner et al. | |
| 6,967,110 B2 | * | 11/2005 | Guldi et al. | 438/11 |
| 6,995,393 B2 | * | 2/2006 | Weiner et al. | 257/48 |
| 7,187,179 B1 | * | 3/2007 | Scaman et al. | 324/512 |

FOREIGN PATENT DOCUMENTS

EP      1480227 A1 * 11/2004

OTHER PUBLICATIONS

Babazadeh et al., "First Look at Across-chip Performance Variation Using Non-Contact, Performance-Based Metrology," IEEE/SEMI Advanced Semiconductor Manufacturing Conference, 2006, pp. 278-283.
Patterson et al., "Detection of Resistive Shorts and Opens using Voltage Contrast Inspection," IEEE/SEMI Advanced Semiconductor Manufacturing Conference, 2006, pp. 327-333.
Patterson et al., "Detecting resistive shorts and opens using voltage contrast inspection," micromagazine.com, MICRO, Jun. 2006, pp. 67-79.

* cited by examiner

*Primary Examiner*—Vinh P Nguyen
(74) *Attorney, Agent, or Firm*—Dan Schnurmann; Hoffman Warnick LLC

(57) ABSTRACT

A test structure for resistive open detection using voltage contrast (VC) inspection and method for using such structure are disclosed. The test structure may include a comparator within the IC chip for comparing a resistance value of a resistive element under test to a reference resistance and outputting a result of the comparing that indicates whether the resistive open exists in the resistive element under test, wherein the result is detectable by the voltage contrast inspection.

29 Claims, 3 Drawing Sheets

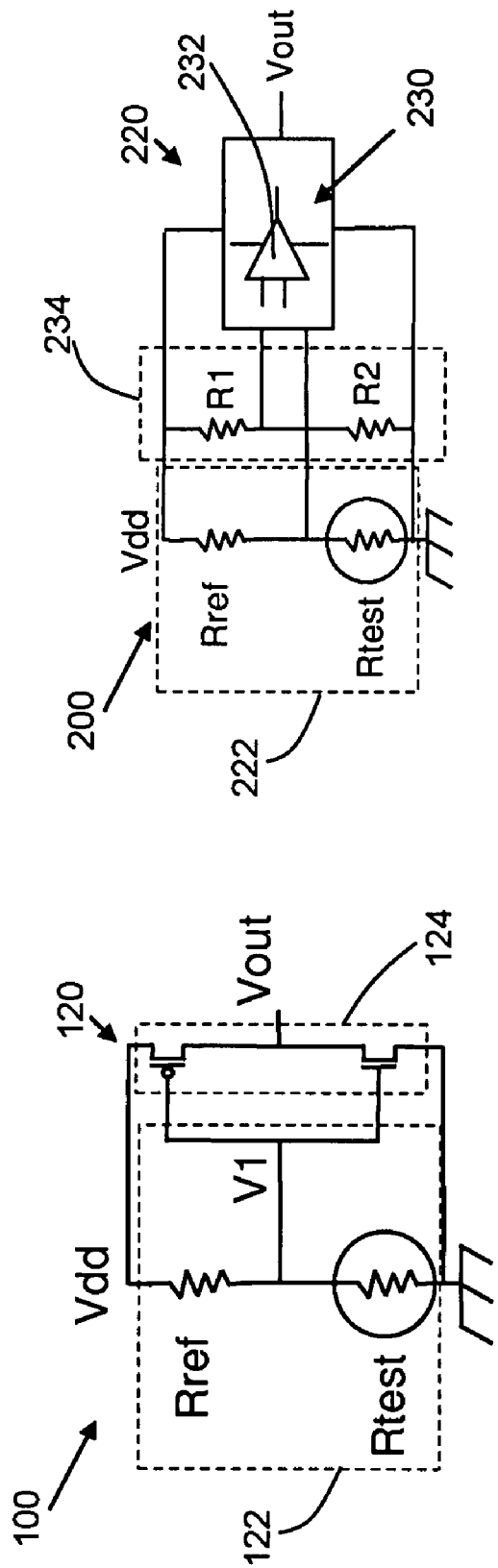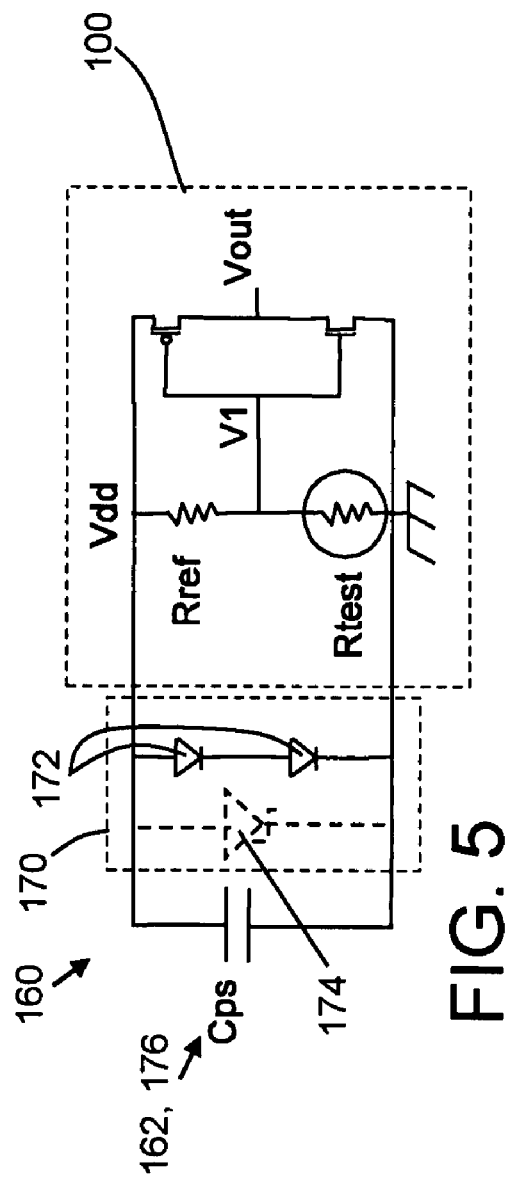
FIG. 4
FIG. 3
FIG. 5

TEST STRUCTURE FOR RESISTIVE OPEN DETECTION USING VOLTAGE CONTRAST INSPECTION AND RELATED METHODS

BACKGROUND

1. Technical Field

The disclosure relates generally to integrated circuit (IC) chip inspection, and more particularly, to a test structure for resistive open detection using voltage contrast (VC) inspection, and a method of powering a test structure.

2. Background Art

In-line voltage contrast (VC) inspection is a powerful technique for detecting and isolating yield limiting defects in the semiconductor fabricating industry. In-line VC inspection includes scanning the wafer surface in which test structures exist with a scanning electron microscope (SEM). As the inspection proceeds, the SEM induces a charge on all electrically floating elements whereas any grounded elements remain at zero potential. This potential difference is visible to the SEM. In particular, for electron landing energies less than the second crossover of the secondary electron yield curve (approximately 1.5 keV for tungsten (W) and copper (Cu)), grounded elements appear bright whereas floating elements appear dark.

Test structures exploiting this phenomenon can be created for many yield limiting defects including metal, gate and active region shorts and opens, and via and contact opens. For example, FIGS. 1A-B, show a short (FIG. 1B) indicated by a normally floating (dark) element becoming bright, and an open (FIG. 1A) indicated when a normally bright element becomes dark. FIG. 1C shows a gate level open indicated when a normally bright element becomes dark. As shown, even if the defect causing the electrical failure is buried or extremely small, its existence is indicated by a change in the VC signal of the entire element. In addition, the exact location of an open is indicated by a change in the VC signal of the structure after the break.

In addition to timely detection of yield limiting defects, this technique has several other major advantages. First, the location of a defect is flagged by the VC signal. Even if the defect causing the short is buried or extremely small, the VC signal appears on the entire element. Second, large areas can be inspected providing a large volume of data.

In this area, resistive defects that are below the typical sensitivity of an inspection SEM present a challenge to detect. In particular, because of the nature of the voltage contrast effect, resistive defects such as opens of approximately 1 M-ohms or less cannot currently be detected. The maximum current generated by current inspection SEMs is around 500 nA. The percentage of this current that flows through the resistance is not enough to generate a voltage that is detectable above the noise level.

In some situations, resistive defects can be detected using VC inspection, but for reasons other than the VC effect. For instance, resistive contacts which are hollow may be detected because of the physical difference in the surface and the materials contrast if the liner is exposed. In many other situations, however, resistive defects exist without manifestation at the wafer surface during VC inspection. These include most resistive contacts and vias, and nickel silicide (NiSi) pipes. Currently, these types of defects with resistance below 1 M-ohms cannot be detected using VC inspection.

SUMMARY

A test structure for resistive open detection using voltage contrast (VC) inspection. The test structure may include a comparator within the IC chip for comparing a resistance value of a resistive element under test to a reference resistance and outputting a result of the comparing that indicates whether the resistive open exists in the resistive element under test, wherein the result is detectable by the voltage contrast inspection. A method powering a test structure may include providing a capacitor coupled to the test structure, the capacitor including a conductor at a surface of the wafer; and charging the capacitor using a voltage contrast (VC) inspection tool used to evaluate the test structure.

An aspect of the disclosure provides a test structure for detecting a resistive open during forming of an integrated circuit (IC) chip using voltage contrast inspection, the test structure comprising: a comparator within the IC chip for comparing a resistance value of a resistive element under test to a reference resistance and outputting a result of the comparing that indicates whether the resistive open exists in the resistive element under test, wherein the result is detectable by the voltage contrast inspection.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 3 shows one embodiment of a test structure according to the disclosure.

FIG. 4 shows another embodiment of a test structure according to the disclosure.

FIG. 5 shows embodiments of a power generator for the test structures of FIGS. 3 and 4 according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1C:
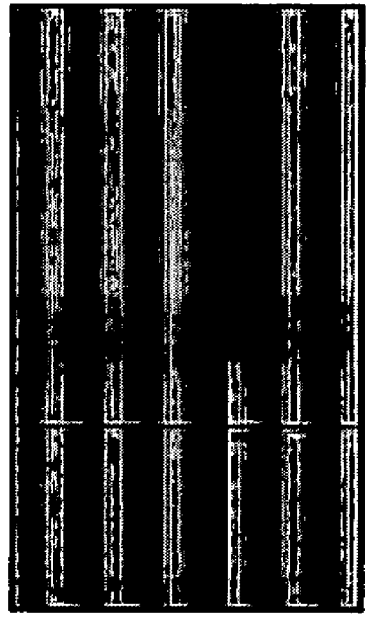
FIGS. 1A-C show images of defects observed using conventional voltage contrast (VC) inspection.
Figure 1B:
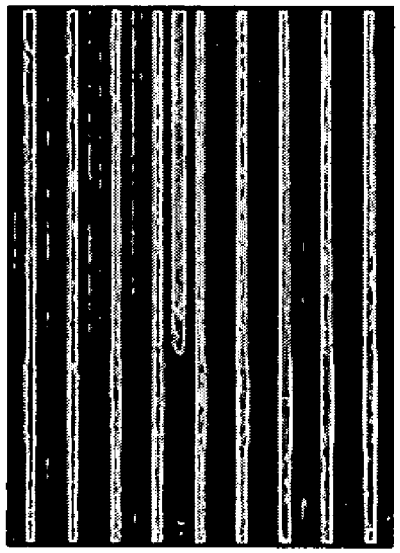
Figure 1A:
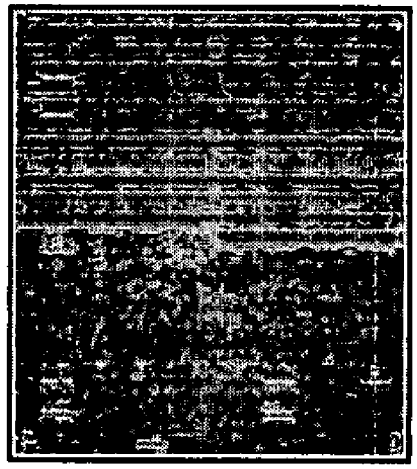
Figure 2:
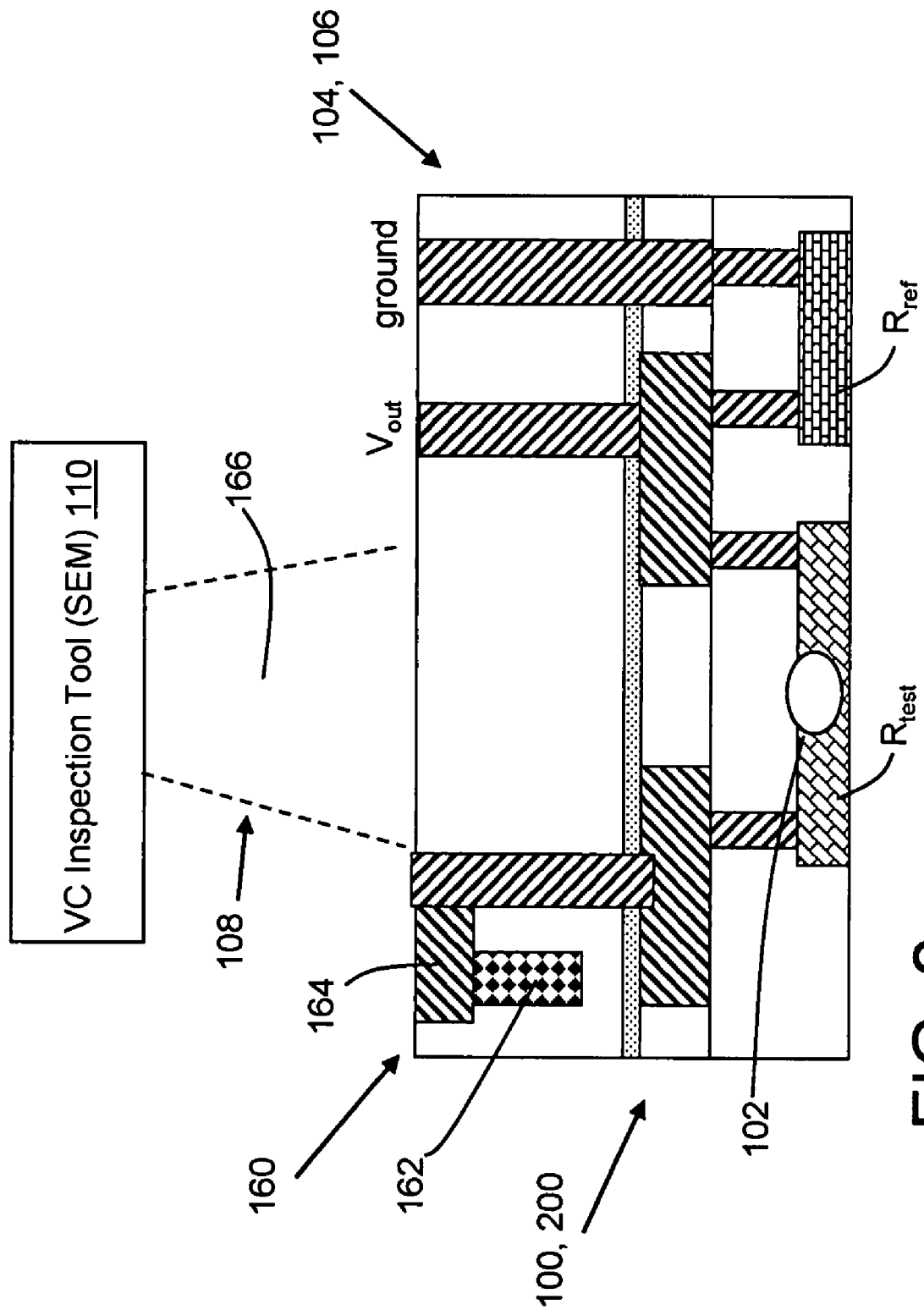
FIG. 2 shows an illustrative environment of voltage contrast inspection employing a test structure and method according to the disclosure.

Referring to the drawings, FIG. 2 shows a test structure 100, 200 for implementing a method of detecting a resistive open 102 during forming of an integrated circuit (IC) chip 104 using voltage contrast inspection. Each test structure 100, 200 is formed in an IC chip 104 during fabrication on a wafer 106 and a voltage contrast (VC) inspection 108 is periodically performed during fabrication to obtain a result from the test structure. Each test structure 100, 200 may be formed using any now known or later developed techniques. Voltage contrast (VC) inspection 108 may use any now known or later developed technique, e.g., using VC inspection tool 110 including a scanning electron microscope (SEM). Note, FIG. 2 only shows a simplified view of a test structure 100, 200, details of which are shown in FIGS. 3 and 4.

FIG. 3 shows one embodiment of a test structure 100 and FIG. 4 shows a second embodiment of a test structure 200. In each embodiment, test structure 100, 200 includes a comparator 120, 220 for comparing a resistance value of a resistive element under test $R_{test}$ to a reference resistance $R_{ref}$ and outputting a result indicating whether resistive open 102 (FIG. 2) exists in the resistive element under test. The resistive element under test may be any structure within IC chip 104 (FIG. 2) that evaluation for the existence of a resistive open 102 (FIG. 20) is desired.

Reference resistance ($R_{ref}$) may likewise include any now known or later developed resistive element capable of providing a set resistance value. One challenge for effective implementation of this disclosure is to keep the size of test structure 100, 200 reasonable. A common resistive element uses doped, un-silicided poly-silicon (poly). This poly is doped to provide a sheet resistance on the order of 350 ohms/square. To create a 100 M-ohm resistor, the poly would need to be 40,000 um long, which is too long to be practicable. However, by eliminating the poly dopants, i.e., using an undoped, un-silicided polysilicon, the resistivity would increase by a factor of 10,000. Therefore, reference resistance $R_{ref}$ need only be, for example, 4 um long. Reference resistance $R_{ref}$ may be tuned using any now known or later developed techniques.

In one embodiment, shown in FIG. 3, comparator 120 includes a voltage divider 122 including reference resistance $R_{ref}$ and resistive element under test $R_{test}$. Comparator 120 also includes an inverter 124 to an output V1 of voltage divider 122. An output $V_{out}$ of inverter 124 provides the result. Inverter 124 has a negligible impact on voltage divider 122. In operation, if $R_{test}<R_{ref}$, V1 would be less than half (½) the power supply voltage $V_{dd}$. This result pulls output $V_{out}$ of inverter 124 to a high voltage, e.g., that of a power supply voltage $V_{dd}$. This result indicates that a resistive open 102 (FIG. 2) exists. In contrast, if $R_{test}>R_{ref}$, then output $V_{out}$ would be a low voltage, e.g., ground (0 V). This result indicates that a resistive open 102 (FIG. 2) does not exist.

FIG. 4 shows another embodiment of a test structure 200. In this embodiment, comparator 220 may include a first voltage divider 222 and a voltage comparator 230, such as an operational amplifier (op amp) 232 or other voltage comparing circuit. This embodiment may provide superior accuracy compared to test structure 100 (FIG. 3) by sacrificing some of the ideal characteristics of op amp 232. In this embodiment, first voltage divider 222 includes reference resistance $R_{ref}$ and resistive element under test $R_{test}$, and a second voltage divider 234 (R1 and R2) is coupled to first voltage divider 222. In one embodiment, reference resistance $R_{ref}$ is much larger than the targeted threshold resistance of the resistive element under test $R_{test}$ and to match, R1 is much larger than R2. The motivation for this arrangement is to keep the power drawn through reference resistant $R_{ref}$ and resistive element under test $R_{test}$ at a level that can be sustained by the power source. Second voltage divider 234 generates a reference voltage $V_{ref}$. Operational amplifier 232 is coupled to an output of first and second voltage dividers 222, 234, and an output $V_{out}$ of operational amplifier 232 provides the result.

Referring to FIGS. 2 and 5, in one embodiment of the disclosure, power supply $V_{dd}$ for test structures 100 or 200 is generated in-line by a power generator 160. Note, that while FIG. 5 only shows a power generator 160 for test structure 100 of FIG. 3, it is equally applicable to test structure 200 of FIG. 4. In one embodiment, the powering of test structure 100, 200 uses a capacitor 162 including a conductor 164 at a surface of wafer 106, which is charged by an electron beam 166, e.g., of VC inspection tool 110. That is, electron beam 166 is used for performing voltage contrast inspection 108 and charging capacitor 162 to power test structure 100, 200. If one capacitor 162 does not provide sufficient power, or if more than one test structure 100, 200 needs to be powered, capacitor 162 may include an array 176 of, for example, deep trench capacitors coupled together and to test structure(s) 100, 200, collectively or individually. Array 176 may be tied together with a grid (not shown) at, for example, a first metal layer M1 or the next metal layer. The metal layer would serve to both collect the charge from electron beam 166 and to transfer this charge to test structure(s) 100, 200.

In one embodiment, shown in FIG. 5, power generator 160 may include a power regulator 170, which includes, for example, a diode(s) 172 (e.g., two shown) in parallel with capacitor 162. In an alternative embodiment, diode(s) 172 may be replaced with a zener diode 174 (in phantom). Diode(s) 172 in FIG. 5 may regulate the voltage to, for example, approximately 1.2 V, which might be the target power supply $V_{dd}$. The voltage would gradually decline once electron beam 166 stopped charging it, but test structure 100, 200 is designed so that the decline is minimal in the time period of interest. In another embodiment, power generator 160 is not regulated, i.e., diode(s) 172 or zener diode 174 are eliminated. The actual power supply voltage $V_{dd}$ may not be critical since all the circuitry is powered by the same voltage, i.e., an output of test structures 100, 200 may be independent of power supply voltage $V_{dd}$.

It is understood that an array of test structures 100, 200 may be employed at any one time within IC chip 104, e.g., a million at a time, if possible. Each test structure 100, 200 may have its own power generator 160, e.g., capacitor, or a single power generator, for example, in the form of an array 176 of capacitors, could be used for an array of test structures 100, 200. Where a number of test structures 100, 200 are employed, different test structures 100, 200 may have different reference resistances $R_{ref}$ so different magnitudes of resistive opens 102 can be detected. That is, at least one reference resistance $R_{ref}$ of a test structure in the array may be different than a reference resistance $R_{ref}$ of another test structure in the array.

Returning to FIG. 2, in operation, capacitor 162 or array of capacitors 176 is charged by electron beam 166. VC inspection 108 is then performed of test structure 100, 200. The result $V_{out}$ in the form of a high voltage (e.g., $V_{dd}$) or low voltage (e.g., 0) is detected by VC inspection 108. As a result, test structures 100, 200 allow resistive opens 102 to be detected in-line using VC inspection 108 (FIG. 2). Test structures 100, 200 are also very useful for quantifying the exact resistance of defects.

Test structure 100, 200 as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A test structure for detecting a resistive open during forming of an integrated circuit (IC) chip using voltage contrast inspection, the IC chip including a resistive element under test, the test structure comprising:
   a comparator within the IC chip for comparing a resistance value of the resistive element under test to a reference resistance and outputting a result of the comparing that indicates whether the resistive open exists in the resistive element under test,
   wherein the result is detectable by the voltage contrast inspection.

2. The test structure of claim 1, wherein the comparator includes:
   a voltage divider including the reference resistance and the resistive element under test; and
   an inverter coupled to an output of the voltage divider, wherein an output of the inverter provides the result.

3. The test structure of claim 1, wherein the comparator includes:
   a first voltage divider including the reference resistance and the resistive element under test;
   a second voltage divider coupled to the first voltage divider; and
   an operational amplifier coupled to an output of the first and second voltage dividers,
   wherein an output of the operational amplifier provides the result.

4. The test structure of claim 1, further comprising a capacitor chargeable by an electron beam to power the test structure.

5. The test structure of claim 4, wherein the electron beam is also used for the voltage contrast inspection.

6. The test structure of claim 4, further comprising a power regulator coupled to the capacitor.

7. The test structure of claim 6, wherein the power regulator includes a diode in parallel with the capacitor.

8. The test structure of claim 7, wherein the diode includes a zener diode.

9. The test structure of claim 4, wherein the capacitor includes an array of deep trench capacitors coupled together and to the test structure.

10. The test structure of claim 1, wherein the result is a high voltage or a low voltage detectable by the voltage contrast inspection.

11. The test structure of claim 1, wherein the reference resistance includes an un-silicided, un-doped polysilicon element.

12. An array of test structures of claim 1, wherein at least one reference resistance of a test structure in the array is different than a reference resistance of another test structure in the array.

13. A method of detecting a resistive open during forming of an integrated circuit (IC) chip, the IC chip including a resistive element under test, using voltage contrast inspection, the method comprising:
   forming a test structure in the IC chip, the test structure including a comparator for comparing a resistance value of the resistive element under test to a reference resistance and outputting a result of the comparing that indicates whether the resistive open exists in the resistive element under test; and
   performing the voltage contrast inspection of the test structure that obtains the result.

14. The method of claim 13, wherein the comparator includes:
   a voltage divider including the reference resistance and the resistive element under test; and
   an inverter coupled to an output of the voltage divider, wherein an output of the inverter provides the result.

15. The method of claim 13, wherein the comparator includes:
   a first voltage divider including the reference resistance and the resistive element under test;
   a second voltage divider coupled to the first voltage divider; and
   an operational amplifier coupled to an output of the first and second voltage dividers, wherein an output of the operational amplifier provides the result.

16. The method of claim 13, further comprising powering the test structure using a capacitor charged by an electron beam.

17. The method of claim 16, wherein the electron beam is used for performing the voltage contrast inspection.

18. The method of claim 16, wherein the powering further includes regulating the powering.

19. The method of claim 18, wherein the regulating includes providing a diode in parallel with the capacitor.

20. The method of claim 19, wherein the diode includes a zener diode.

21. The method of claim 16, wherein the capacitor includes an array of deep trench capacitors coupled together and to the test structure.

22. The method of claim 13, wherein the result is a high voltage or a low voltage that can be detected by the VC inspection performing.

23. The method of claim 13, wherein the reference resistance includes an unsilicided, un-doped polysilicon element.

24. A method of powering a test structure in a wafer, the wafer including a resistive element under test, the method comprising:
   providing a capacitor coupled to the test structure, the capacitor including a conductor at a surface of the wafer; and
   charging the capacitor using a voltage contrast (VC) inspection tool used to evaluate the test structure, wherein the test structure includes: a comparator within an integrated circuit (IC) chip of the wafer for comparing a resistance value of the resistive element under test to a reference resistance and outputting a result of the comparing that indicates whether a resistive open exists in the resistive element under test, wherein the result is detectable by the voltage contrast inspection tool.

25. The method of claim 24, wherein the charging includes using an electron beam of the VC inspection tool.

26. The method of claim 24, wherein the capacitor includes an array of deep trench capacitors coupled together and to the test structure.

27. The method of claim 24, wherein the reference resistance includes an unsilicided, un-doped polysilicon element.

28. The method of claim 24, wherein the comparator includes:

a voltage divider including the reference resistance and the resistive element under test; and an inverter coupled to an output of the voltage divider, wherein an output of the inverter provides the result.

29. The method of claim 24, wherein the comparator includes:

a first voltage divider including the reference resistance and the resistive element under test;

a second voltage divider coupled to the first voltage divider; and an operational amplifier coupled to an output of the first and second voltage dividers, wherein an output of the operational amplifier provides the result.

* * * * *